(12) United States Patent
So et al.

(10) Patent No.: US 7,893,474 B2
(45) Date of Patent: Feb. 22, 2011

(54) METHOD AND APPARATUS FOR IMAGING UTILIZING AN ULTRASONIC IMAGING SENSOR ARRAY

(75) Inventors: Franky So, Gainesville, FL (US); Juan Claudio Nino, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 202 days.

(21) Appl. No.: 12/279,412

(22) PCT Filed: Feb. 14, 2007

(86) PCT No.: PCT/US2007/004291

§ 371 (c)(1),
(2), (4) Date: Feb. 2, 2009

(87) PCT Pub. No.: WO2007/095390

PCT Pub. Date: Aug. 23, 2007

(65) Prior Publication Data

US 2009/0127977 A1 May 21, 2009

Related U.S. Application Data

(60) Provisional application No. 60/773,292, filed on Feb. 14, 2006.

(51) Int. Cl.
*H01L 21/02* (2006.01)

(52) U.S. Cl. .............. 257/295; 257/414; 257/E23.002; 310/358

(58) Field of Classification Search .............. 310/311, 310/358; 257/E23.002, 295, 414
See application file for complete search history.

(56) References Cited

U.S. PATENT DOCUMENTS

2007/0152537 A1* 7/2007 Yamaguchi et al. ......... 310/311

FOREIGN PATENT DOCUMENTS

GB 1080238 8/1967
WO WO-2004/032191 4/2004

* cited by examiner

*Primary Examiner*—Michael B Shingleton
(74) *Attorney, Agent, or Firm*—Saliwanchik Lloyd & Eisenschenk

(57) ABSTRACT

The subject invention pertains to a piezoelectric device structure for improved acoustic wave sensing and/or generation, and process for making same. The piezoelectric thin film field effect transducer can be a thin film transistor (TFT) with either a piezoelectric film gate or a composite gate having a dielectric film and a piezoelectric film. The TFT structure can be either a top gate device or a bottom gate device. In an embodiment, the piezoelectric device structure can be used to form an array of piezoelectric thin film field effect transducers. A TFT switch can drive each piezoelectric transducer in the array. The piezoelectric transducers can both generate and sense acoustic waves. In a sensing mode, a signal from an acoustic wave can be collected at a readout terminal of the piezoelectric transducer. In a generating mode, an excitation signal can be applied across the piezoelectric transducer while the switch is 'on'.

37 Claims, 5 Drawing Sheets

METHOD AND APPARATUS FOR IMAGING UTILIZING AN ULTRASONIC IMAGING SENSOR ARRAY

CROSS-REFERENCE TO RELATED APPLICATIONS

The present application is the U.S. national stage application of International Patent Application No. PCT/US2007/004291, filed Feb. 14, 2007, which claims the benefit of U.S. Provisional Application Ser. No. 60/773,292, filed Feb. 14, 2006, both of which are hereby incorporated by reference herein in their entirety, including any figures, tables, or drawings.

BACKGROUND OF INVENTION

A conventional ultrasonic imaging system includes two elements: 1) an element that generates acoustic waves, and 2) a sensor that detects the reflected signals. In a typical ultrasonic imaging procedure, a probe is manually scanned across the imaging area. This procedure can be tedious and time consuming, and often the image quality is poor.

BRIEF SUMMARY

Embodiments of the subject invention pertain to a piezoelectric transducer device for improved acoustic wave sensing and/or generation. Embodiments of the invention relate to a process for making a piezoelectric transducer device. In an embodiment, a plurality of piezoelectric transducer devices can be used to form an array of piezoelectric transducers. Embodiments of the transducer array can eliminate the need for manual scanning, allow low cost fabrication, and/or enable high resolution imaging systems.

In one embodiment, a piezoelectric transducer can be a thin film transistor having a composite gate dielectric layer including a dielectric film and a piezoelectric film. The thin film transistor can be a thin film field effect transistor. In a specific embodiment, the gate dielectric layer can be a composite of a dielectric film such as $SiO_2$ and a piezoelectric film. In another embodiment, a piezoelectric transducer can be a thin film transistor having a piezoelectric film gate. The thin film transistor can be a thin film field effect transistor. In a specific embodiment, a single piezoelectric film can be used as the gate.

DETAILED DISCLOSURE

Embodiments of the subject invention pertain to a piezoelectric transducer device for improved acoustic wave sensing and/or generation. Embodiments of the invention relate to a process for making a piezoelectric transducer device. In an embodiment, a plurality of piezoelectric transducer devices can be used to form an array of piezoelectric transducers. Embodiments of the transducer array can eliminate the need for manual scanning, allow low cost fabrication, and/or enable high resolution imaging systems.

In one embodiment, a piezoelectric transducer can be a thin film transistor having a composite gate dielectric layer including a dielectric film and a piezoelectric film. The thin film transistor can be a thin film field effect transistor. In a specific embodiment, the gate dielectric layer can be a composite of a dielectric film such as $SiO_2$ and a piezoelectric film. In another embodiment, a piezoelectric transducer can be a thin film transistor having a piezoelectric film gate. The thin film transistor can be a thin film field effect transistor. In a specific embodiment, a single piezoelectric film can be used as the gate.

Figure 1:
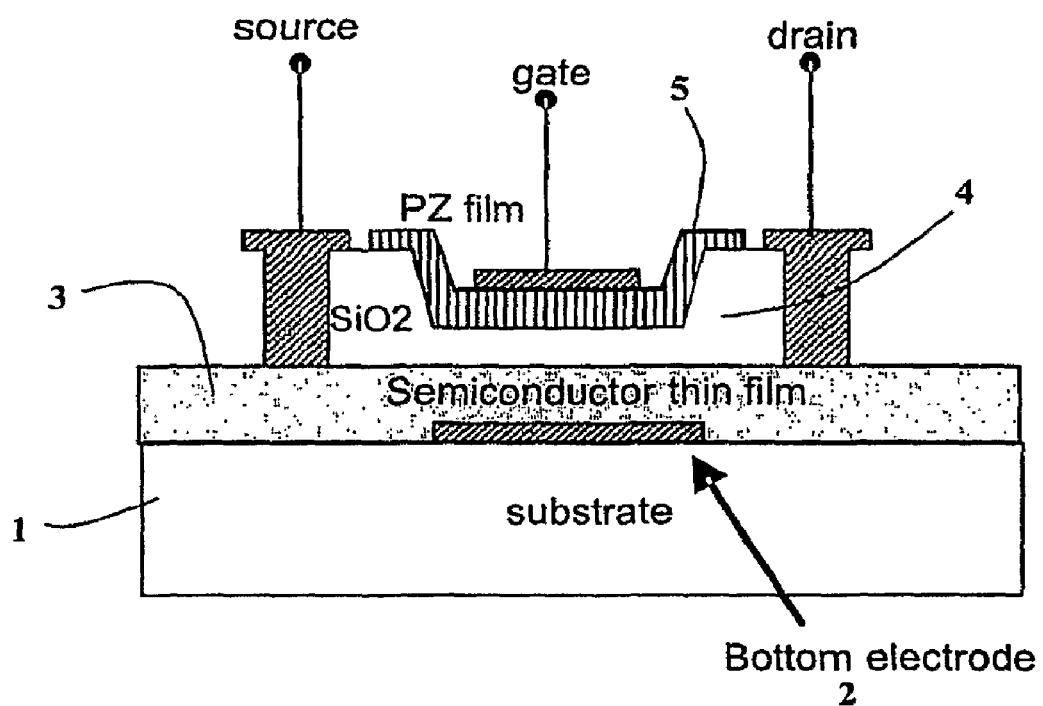
FIG. 1 shows an embodiment of a top gate piezoelectric thin film transducer in accordance with the subject invention.
Figure 2:
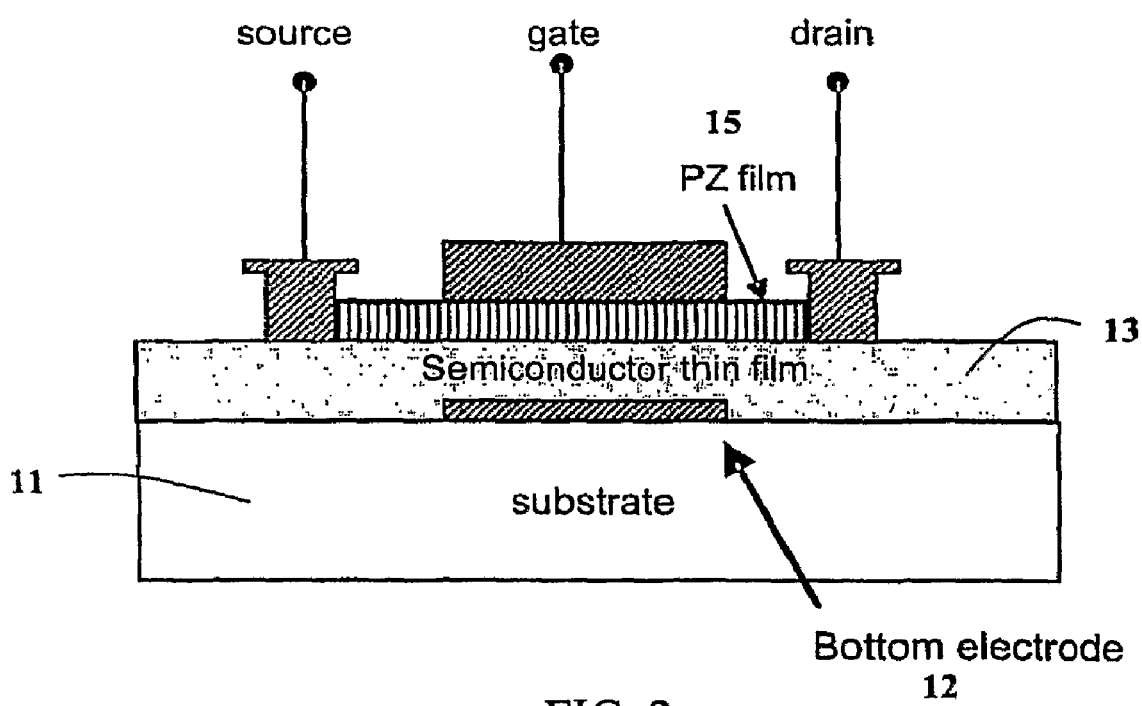
FIG. 2 shows an embodiment of a top gate piezoelectric thin film transducer in accordance with the subject invention.

In embodiments of the subject invention, the piezoelectric thin film transducer can have a top gate device structure. The top gate device structures can incorporate a piezoelectric film or a composite of a dielectric film and piezoelectric film. FIG. 1 shows an embodiment of the piezoelectric thin film transducer, where the piezoelectric thin film transducer is a thin film field effect transistor with a composite piezoelectric/insulator gate. Referring to FIG. 1, the piezoelectric thin film transducer can be a thin film transistor with substrate 1 on which a bottom, or excitation, electrode 2 and a semiconductor thin film 3 are deposited. An active region (not shown) can be formed in the semiconductor thin film 3. A layer of dielectric film 4 and a layer of piezoelectric film 5 create a gate region. The placement of the gate region with respect to the active region defines the source and drain regions. Gate, source, and drain electrodes can be used to control the device. FIG. 2 shows an embodiment of the piezoelectric thin film transducer where the piezoelectric thin film transducer is a thin film field effect transistor with a piezoelectric film gate. In this embodiment, the piezoelectric thin film transducer can also be a thin film transistor with substrate 11 on which a bottom, or excitation, electrode 12 and a semiconductor thin film 13 are deposited. Rather than having both a layer of dielectric film and a layer of piezoelectric film, the embodiment shown in FIG. 2 uses a piezoelectric film 15 to create a gate region.

Figure 3:
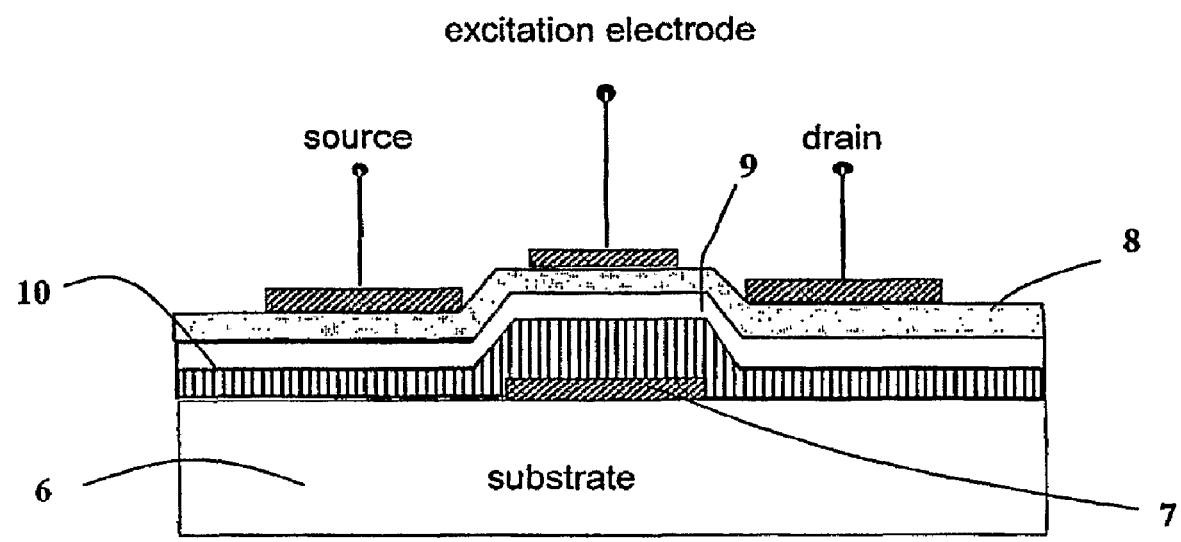
FIG. 3 shows an embodiment of a bottom gate piezoelectric thin film transducer in accordance with the subject invention.

In embodiments of the subject invention, the piezoelectric thin film transducer can have a bottom gate device structure. FIG. 3 shows an embodiment of the piezoelectric thin film transducer where the piezoelectric thin film transducer is a thin film field effect transistor having a bottom gate device structure. In a bottom gate device structure, a gate electrode is at the bottom of the semiconductor layer. Referring to FIG. 3, a gate electrode 7 is formed on substrate 6. Piezoelectric film 10 and gate dielectric film 9 can be deposited on the top of the gate electrode and exposed substrate. Semiconductor thin film 8 can be deposited on the dielectric layer 9. Source, drain, and excitation electrodes can then be formed on the semiconductor thin film 8. The bottom gate device structure allows for a low temperature process for depositing the semiconductor thin film.

Embodiments of the subject invention can be used for both generating and sensing acoustic waves. In an embodiment, the piezoelectric thin film transducer can generate an acoustic wave when a signal is applied to the excitation electrode while the piezoelectric thin film transducer is in active mode, for example when $|V_{DS}|>|V_{Dsat}|\cong|V_{GS}-V_T|>0$. The echo of the acoustic wave can be sensed by the piezoelectric thin film transducer because of the effects of the acoustic wave on the piezoelectric layer. The signal can be determined by the voltage at the drain of the piezoelectric thin film transducer when the transducer is active. In a specific embodiment, a thin film transistor (TFT) switch can drive a piezoelectric thin film transducer. For a sensing mode, a signal from an acoustic wave can be collected at a readout terminal of the piezoelectric thin film transducer. In a specific embodiment, the readout terminal can be electrically connected to the drain of the piezoelectric thin film transducer. For a generating mode, an excitation signal can be applied across the piezoelectric thin film transducer while the switch is 'on' to generate an acoustic wave.

Figure 4:
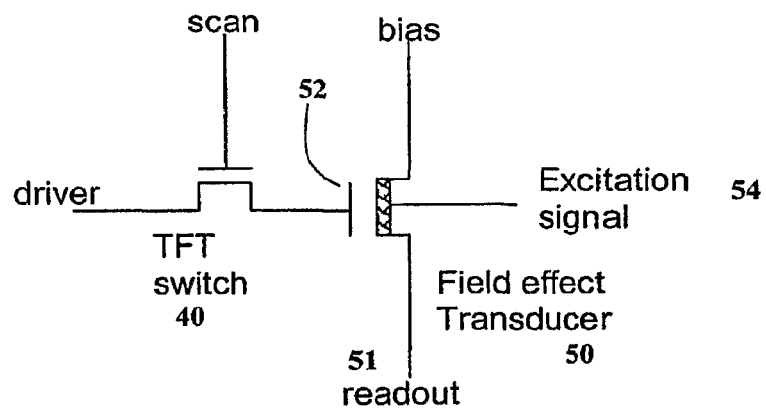
FIG. 4 shows a schematic of a transducer for ultrasonic imaging driven by a TFT switch in accordance with an embodiment of the subject invention.

In an embodiment, an acoustic wave can be generated by applying an ac voltage across the piezoelectric film of a piezoelectric thin film transducer. The piezoelectric thin film transducer can be of any structure as indicated above. A schematic circuit diagram is shown in FIG. 4. A TFT switch 40 can be used to drive the transducer 50. A signal from a received acoustic wave can be collected at the readout terminal 51. Acoustic waves can be generated from the transducer 50 by applying an ac voltage across the piezoelectric film, such as by applying an excitation signal 54 across the transducer 50 while the TFT switch 40 is on. In a specific embodiment, an excitation signal 54 can be applied between the bottom electrode of the transducer 50 and the gate electrode 52 of the transducer 50 to generate acoustic waves. A plurality of the subject TFT switches and corresponding plurality of the subject piezoelectric thin film transducers can be formed in an array, in accordance with an embodiment of the invention. In a specific embodiment, a large area array can be fabricated of thin film transistors and transducers.

Figure 5:
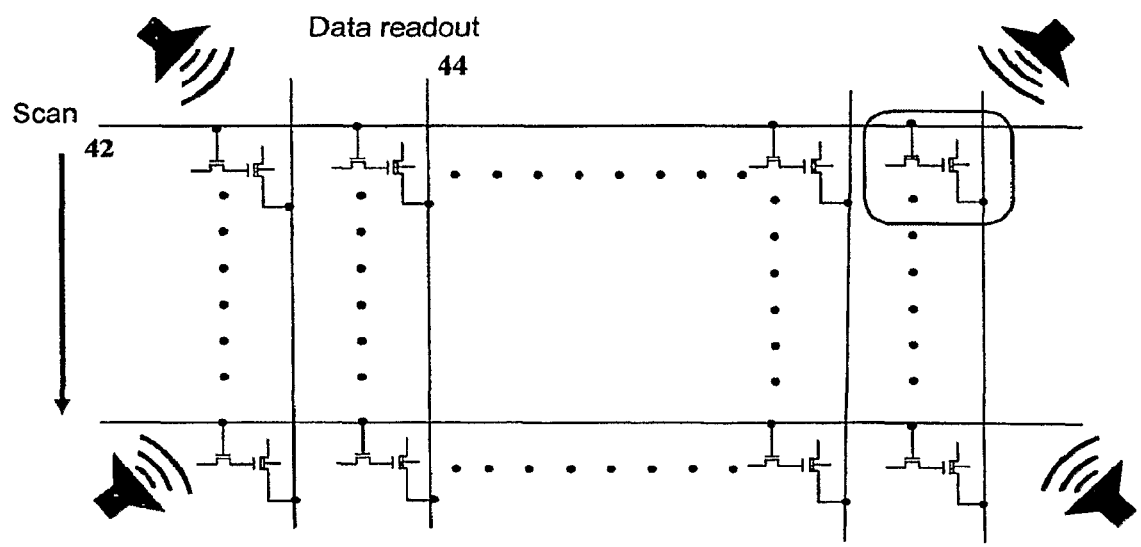
FIG. 5 shows a schematic of an array of transducers for ultrasonic imaging each driven by a TFT switch in accordance with the subject invention.

Referring to FIG. 5, acoustic sensor array signals can be applied to the scan lines 42 from the scan drivers. Data can be read from the data readout lines 44. Excitation signals can be applied between the bottom electrode 54 and the gate electrode 52 to generate acoustic waves, and reflected signals can be detected by the field-effect transducers via readout terminal 51.

In a specific embodiment, the substrate can be formed of a glass substrate such as Corning 1737f, Al—B—Si—O (LCD-type glass). Preferably, the substrate material is selected such that the thermal expansion coefficient of the substrate material matches the thermal expansion coefficient of the piezoelectric film. As lead zirconate titanate, (PZT) Pb/Si interdiffusion can occur during annealing, and lanthanum nitrate can be used as buffer layer. The bottom electrode located on the substrate can be formed by, for example, layering 50 nm of Ti on the glass and then 200 m of Pt on the Ti.

For embodiments having a top gate device structure, the gate, source and drain electrodes can be formed of, for example, Au, Ti/Au, or Al.

In alternative embodiments, the substrate can be formed of polymer. The use of a polymer or plastic substrate can enhance the flexibility of the subject device. In a specific embodiment, polyimides such as Kapton, can be used in environments having temperatures up to 350° C. Other polymer substrates can be used. Such polymers have lower temperature limits for operation. Examples include, but are not limited to: low temperature: PET (100° C.), polyphenyl sulfides (180° C.), polyisocyanates (140° C.), and Polypropylene adipate (140° C.).

The semiconductor thin film materials incorporated with transducers in accordance with the subject invention can include amorphous silicon, polycrystalline silicon by low temperature laser annealing, organic semiconductors such as pentacene, and conjugated polymers such as polythiophene.

The piezoelectric thin films can include non-ferroelectric piezoelectrics, such as ZnO and AlN, ferroelectric films, such as $Pb(Zr,Ti)O_3$ (PZT), and bismuth layered oxides such as $Bi_4Ti_3O_{12}$. For high sensitivity sensors and low voltage operation, the higher piezoelectric response available in ferroelectric films can be preferable.

In an embodiment, the piezoelectric layer can incorporate ceramics such as ZnO, AlN, and/or PZT. The properties of ZnO, AlN, and PZT are shown in Table I from S. Trolier-McKinstry and P. Muralt, Journal of Electroceramics, 12, 7-17, 2004.

TABLE 1

Thin film piezoelectric and dielectric properties.

| Coefficients/figures of merit | ZnO [40, 41] | AlN [31, 42] | PZT (1-3 μm) [43] |
|---|---|---|---|
| $e_{31,f}$ (Cm$^{-2}$) | −1.0 | −1.05 | −8 ... −12 |
| $d_{33,f}$ (pm/V) | 5.9 | 3.9 | 60 ... 130 |
| $\epsilon_{33}$ | 10.9 | 10.5 | 300 ... 1300 |
| $e_{31,f}^2/\epsilon_0\epsilon_{33}$ (GV/m) | −10.3 | −11.3 | −0.7 ... −1.8 |
| $e_{31,f}^2/\epsilon_0\epsilon_{33}$ (GPa) | 10.3 | 11.9 | 6 ... 18 |
| tan δ (@ 1 to 10 kHz, $10^5$ V/m) | 0.01 ... 0.1 | 0.003 | 0.01 ... 0.03 |
| $e_{31,f}/\sqrt{(\epsilon_0\epsilon_{33}\tan\delta)}$ ($10^5$ Pa$^{1/2}$) | 3 ... 10 | 20 | 4 ... 8 |
| $c_{33}^E$ (GPa) | 208 | 395 | 98 (PZT52/48 ceramic) |
| $d_{33,f}^2 \cdot c_{33}^E/\epsilon_0\epsilon_{33}$ | 7.4% | 6.5% | 7% ... 15% |

In another embodiment, the piezoelectric layer can be selected from Polymers such as polyvinylidene fluoride (PVDF), vinylidene fluoride—trifluoroethylene copolymer P(VDF-TrFE), vinylidene fluoride—tetrafluoroethylene copolymer P(VDF—TeFE), vinylidene cyanide—vinylacetate copolymer P(VDCN-VAC), and Nylons such as Nylon-5, Nylon-7, and Nylon-11. Characteristics of PVDF, VDF, TrFE, and PZT 4 can be found in the following chart from Q. X. Chen and P. A. Payne, *Meas. Sci. Technol.*, 6, 249-67, 1995.

| Property | PVDF | VDF-TlFE | PZT 4 |
|---|---|---|---|
| Density ($10^3$ kg m$^{-3}$) | 1.78 | 1.88 | 7.50 |
| Acoustic velocity (km s$^{-1}$) | 2.26 | 2.40 | 4.60 |
| Acoustic impedance (MRayl) | 20 | 4.51 | 34.80 |
| Elastic constant, C ($10^8$ N m$^{-2}$) | 9.10 | 11.30 | 159.00 |
| Coupling factor, $k_t$ | 0.20 | 0.30 | 0.51 |
| Piezoelectric constants | | | |
| $e_{33}$ (C m$^{-2}$) | −0.16 | −0.23 | 15.10 |
| $h_{33}$ ($10^9$ V m$^{-1}$) | −2.90 | −4.30 | 2.70 |
| $g_{33}$ (Vm N) | −0.32 | −0.38 | 0.025 |
| $d_{33}$ (pC N$^{-1}$) | 25.00 | 12.50 | −123.00 |
| Dielectric constant, $e_g/\epsilon_0$ | 6.20 | 6.00 | 635.00 |
| Mechanical Q factor | 6-10 | 5-10 | |
| Mechanical loss tangent, tan $\delta_m$ | 0.10 | 0.05 | 0.004 |
| Dielectric loss tangent, tan $\delta_e$ | 0.25 | 0.15 | 0.02 |
| Pyroelectric constant (μC m$^{-2}$ K) | 35.00 | 50.00 | |
| Coercive field, $E_c$ (MV m$^{-1}$) | 45.00 | 36.00 | |

-continued

| Property | PVDF | VDF-TrFE | PZT 4 | |
|---|---|---|---|---|
| Thermal stability (° C.) | 90.00 | 120-150 | | |
| Transmitting efficiency, $Y_T$ | 6.9 | 7.4 | 70 | (PZT 5A) |
| Receiving efficiency, $V_R$ | 1.35 | 1.89 | 0.21 | (PZT 5A) |
| $Y(=Y_T Y_R)$ | 9.30 | 14.0 | 14.7 | (PZT 5A) |

Figure 6:
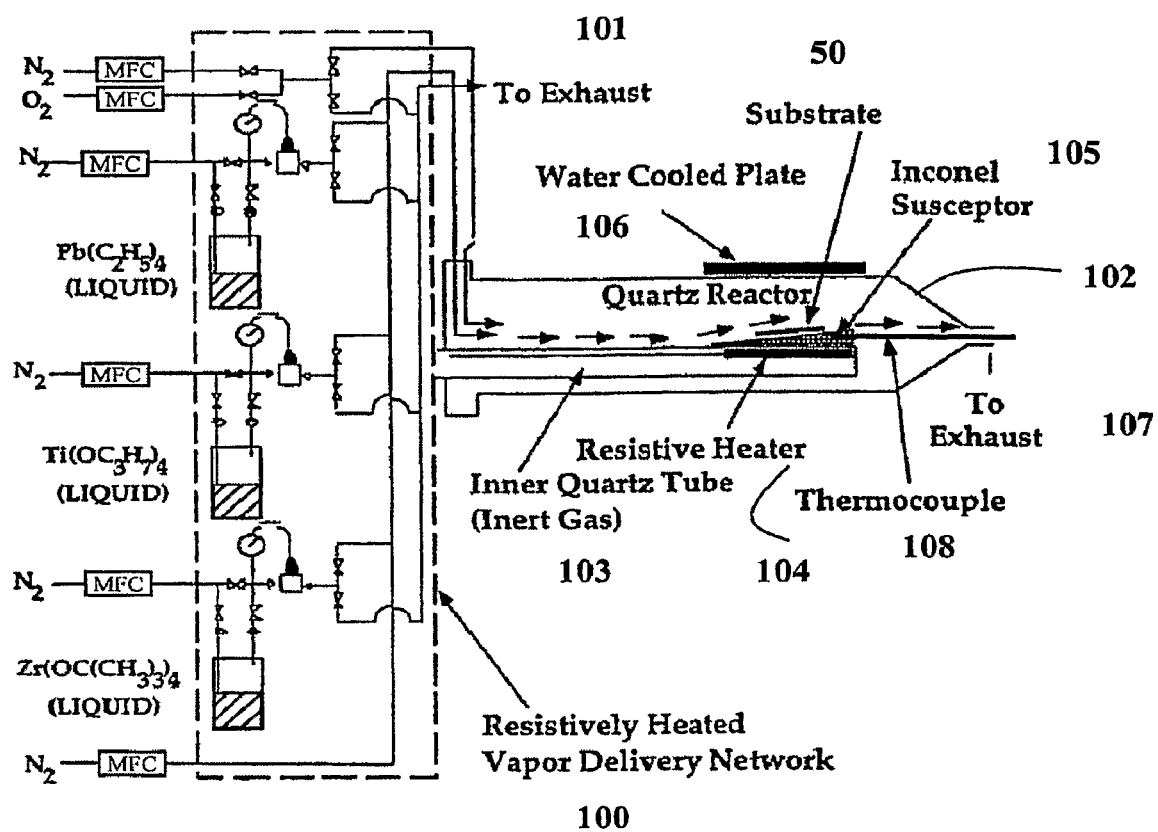
FIG. 6 shows a schematic of a MOCVD for depositing piezoelectric material on a substrate in accordance with an embodiment of the subject invention.

The piezoelectric layer can be formed by any satisfactory method. FIG. 6 shows a specific embodiment of a metal organic chemical vapor deposition (MOCVD) system for piezoelectric thin film deposition. In this embodiment, the piezoelectric layer is formed of a lead-zirconate-titanate (PZT). The compounds used as the PZT precursors are shown in FIG. 6 as $Pb(C_2H_5)_4$ (liquid), $Ti(OC_3H_7)_4$ (liquid), and $Zr(OC(CH_3)_3)_4$ (liquid). The MOCVD system includes a resistively heated vapor delivery network 100 for delivering the PZT precursors to the quartz reactor 102 and undesired vapor to exhaust 101. The quartz reactor 102 has an inner quartz tube 103 that contains an inert gas and a resistive heater 104. The resistive heater 104 heats the substrate 50. A susceptor 105 is used to transfer heat from the resistive heater 104 to the substrate 50. The susceptor 105 can be made of a conductive material such as Iconel. A water cooled plate 106 abuts the quartz reactor 102 opposite the resistive heater 104. A thin film of piezoelectric material is deposited on the substrate 50 as the vapor with PZT precursors passes over the heated substrate 50 and under the water cooled plate 106. Undesired remnants are led to exhaust 107. Measurement of the temperature of the substrate heating region can be taken by a thermocouple 108 located within the susceptor 105.

Figure 7:
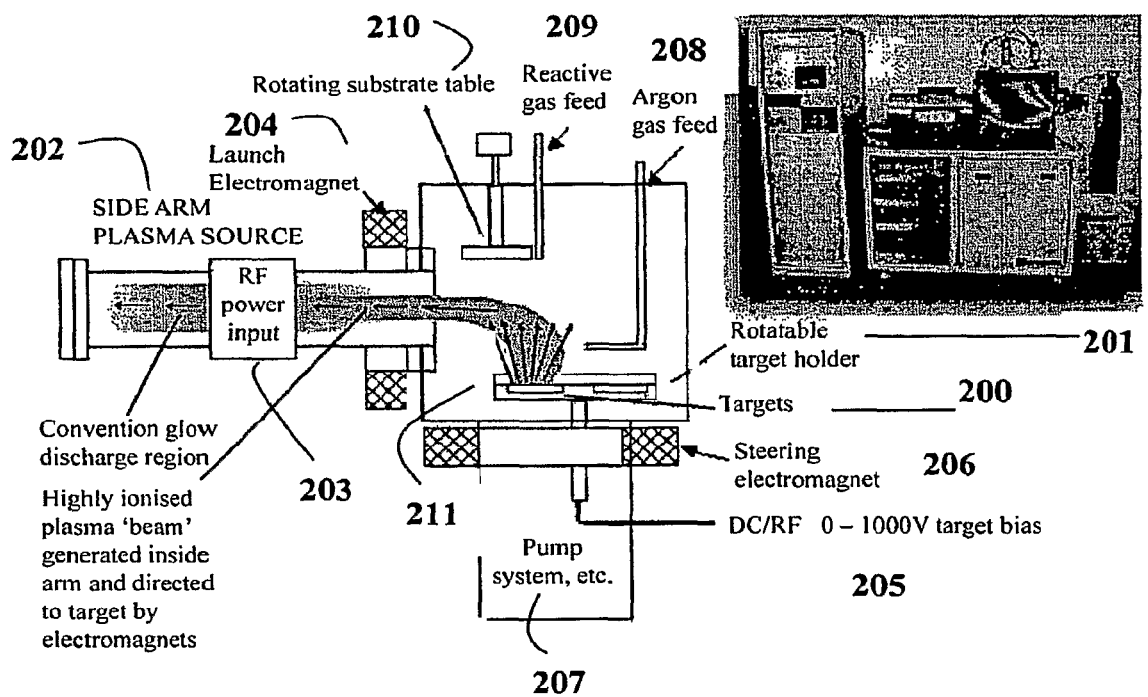
FIG. 7 shows a schematic of a RF sputtering system for depositing piezoelectric material on a substrate in accordance with an embodiment of the subject invention.

FIG. 7 shows a schematic of a RF-Sputtering system that can be used in accordance with the subject invention. This system can be used for piezoelectric thin film deposition on a substrate, such as glass. In a specific embodiment, the piezoelectric layer is formed from a sintered oxide ceramic disc (ZnO) target. The RF sputtering system can include a sputtering chamber 211 and a side arm 202. In an embodiment, the side arm plasma source 202 generates a highly ionized plasma beam of glow discharge that is directed to the target 200 by electromagnets such as launch electromagnet 204 and steering electromagnet 206. In a specific embodiment, a 150 W RF power input 203 can be used to produce the plasma. The RF power input 203 maintains the plasma glow discharge as it is directed to the target 200. The target 200 can be held by a rotatable target holder 201 within the sputtering chamber 211. An argon gas feed 208 provides argon gas and a reactive gas feed 209 can provide oxygen gas. Pump systems 207 can help control the pressure in the sputtering chamber 211. In a specific embodiment, the sputtering pressure can be, for example, $1.5 \times 10^{-2}$ Torr, $O_2$/Ar atmosphere. The erosion due to bombardment of glow discharge on the ZnO target 200, which is powered by a DC/RF 0-1000V target bias 205, can form a layer of piezoelectric material on a glass substrate. In a specific embodiment, the glass substrate can be attached to a rotating substrate table 210.

Piezoelectric thin film deposition can also be conducted through Chemical Solution Deposition (sol-gel). In a specific embodiment, the PZT precursors can include lead acetate, acetic acid, zirconium n-propoxide, titanium n-propoxide, and ethylene glycol. In an embodiment, a piezoelectric layer can be deposited on a substrate by spin coating the substrate with a PZT chemical solution such that a PZT precursor film is formed. The PZT precursor film decomposes into a polycrystalline film during heating. A hot plate can be used to dry the substrate having PZT precursor film, and rapid thermal annealing (RTA) can be performed at a temperature such as 620° C. to form the piezoelectric film layer. In alternative embodiments, low pressure modulated plasma jet reactive sputtering rubber stamp printing/transfer method can be used to perform piezoelectric thin film deposition.

As discussed above, embodiments of the subject invention can be fabricated on a glass or plastic substrate. In an embodiment of the subject invention, a top gate device can be fabricated by depositing and patterning metal thin film for bottom electrodes. Then a semiconductor film can be deposited. The semiconductor film can be, for example, polymer, small molecule organic, and/or inorganic semiconductors, such as amorphous silicon or polycrystalline silicon. In a specific embodiment having a composite piezoelectric/insulator gate, gate dielectric thin films can be deposited and then a piezoelectric thin film can be deposited by, for example, chemical vapor deposition. In alternate embodiments, the piezoelectric thin film can be deposited as discussed above. Once the piezoelectric film has been deposited, the gate, source and drain contacts can be patterned by, for example, photolithography. In an embodiment, the gate, source and drain electrode can be deposited by vacuum deposition.

In another embodiment of the subject invention, a bottom gate device can be fabricated by depositing and patterning metal thin film for bottom electrodes on a glass or plastic substrate. Then a piezoelectric thin film can be deposited. In a specific embodiment, the piezoelectric thin film can be deposited by chemical vapor deposition. In an embodiment having a composite piezoelectric/insulator gate, gate dielectric thin films can be deposited on the piezoelectric thin film. A semiconductor film can then be deposited. The semiconductor film can be polymer, small molecule organic, and/or inorganic semiconductors, such as amorphous silicon or polycrystalline silicon. The gate, source and drain contact areas can be opened and accessed by, for example, photolithography and/or etching. The gate, source and drain electrode can be deposited by vacuum deposition.

The transistors can be fabricated in a range of sizes. In a specific embodiment, the thickness of piezoelectric gate can be from 20 nm to 500 nm in thickness, the thickness of the insulator gate can be 20 nm to 500 nm, and the FET channel length can be 100 nm to 10 um. In a specific embodiment, the semiconductor thin film 3 can be about 50 nm to 500 nm in thickness. In various embodiments, an array of thin film transistors can be positioned on a substrate that is at least 1 inch by 1 inch, and up to 10-20 inches by 10-20 inches. The array can have 1000 transistors by 1000 transistors, or more.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

We claim:

1. A device for acoustic wave sensing and/or generation, comprising:
   a thin film transistor formed on a substrate, wherein the thin film transistor comprises:
      an excitation electrode;
      a semiconductor thin film in contact with the excitation electrode;
      an active region in the semiconductor thin film;

a gate region comprising a piezoelectric layer, wherein the gate region is in contact with the active region;

a gate electrode, wherein the gate electrode is in electrical contact with the piezoelectric layer, wherein at least a portion of the piezoelectric layer is between the gate electrode and the semiconductor thin film, wherein the gate region and the gate electrode define a source region and drain region;

a source electrode, wherein the source electrode is in electrical contact with the source region; and a drain electrode, wherein the drain electrode is in electrical contact the drain region.

2. The device according to claim 1, wherein the gate region comprises a dielectric layer, wherein the dielectric layer is positioned between the semiconductor thin film and the piezoelectric layer.

3. The device according to claim 1, wherein the device further comprises:

a means for putting the thin film transistor in active mode; and a means for applying an excitation signal to the excitation electrode, wherein the thin film transistor is configured such that acoustic waves are generated by the application of the excitation signal to the excitation electrode while the thin film transistor is in active mode.

4. The device according to claim 1, wherein the device further comprises:

a means for putting the thin film transistor in active mode, and a means for monitoring a voltage of the drain electrode, wherein the thin film transistor is configured such that acoustic waves are sensed by monitoring the voltage of the drain electrode while the thin film transistor is in active mode.

5. The device according to claim 3, further comprising:

a means for monitoring a voltage of the drain electrode after application of the excitation signal to the excitation electrode, wherein the thin film transistor is configured such that acoustic waves are sensed by monitoring the voltage of the drain electrode, while the thin film transistor is in active mode.

6. The device according to claim 1, further comprising:

at least one additional thin film transistor formed on the substrate, wherein each of the at least one additional thin film transistors comprises:

an excitation electrode;

a semiconductor thin film in contact with the excitation electrode;

an active region in the semiconductor thin film;

a gate region comprising a piezoelectric layer, wherein the gate region is in contact with the active region;

a gate electrode, wherein the gate electrode is in electrical contact with the piezoelectric layer, wherein at least a portion of the piezoelectric layer is between the gate electrode and the semiconductor thin film, wherein the gate region and the gate electrode define a source region and drain region;

a source electrode, wherein the source electrode is in electrical contact with the source region; and a drain electrode, wherein the drain electrode is in electrical contact the drain region.

7. The device according to claim 6, wherein the at least one additional thin film transistor formed on the substrate comprises at least three additional thin film transistors, wherein the thin film transistor and the at least three additional thin film transistors are positioned to form an array of thin film transistors.

8. The device according to claim 1, further comprising a thin film transistor switch, wherein the thin film transistor switch drives the thin film transistor.

9. The device according to claim 7, further comprising:

a thin film transistor switch, wherein the thin film transistor switch drives the thin film transistor; and a corresponding at least three additional thin film transistor switches, wherein each of the corresponding at least three additional thin film transistor switches drives a corresponding one of the at least three thin film transistors.

10. The device according to claim 1, wherein the excitation electrode is positioned on the substrate, wherein the semiconductor thin film is deposited on the substrate and over the excitation electrode, wherein the gate region is on the active region.

11. The device according to claim 1, wherein the gate electrode is positioned on the substrate, wherein the piezoelectric layer is deposited on the substrate and over the gate electrode, wherein the excitation electrode is on the active region.

12. The device according to claim 1, wherein the excitation electrode is substantially parallel with the gate electrode.

13. A method for generating and/or sensing acoustic waves, comprising:

providing a thin film transistor formed on a substrate, wherein the thin film transistor comprises:

an excitation electrode;

a semiconductor thin film in contact with the excitation electrode;

an active region in the semiconductor thin film;

a gate region comprising a piezoelectric layer, wherein the gate region is in contact with the active region;

a gate electrode, wherein the gate electrode is in electrical contact with the piezoelectric layer, wherein at least a portion of the piezoelectric layer is between the gate electrode and the semiconductor thin film, wherein the gate region and the gate electrode define a source region and drain region;

a source electrode, wherein the source electrode is in electrical contact with the source region; and a drain electrode, wherein the drain electrode is in electrical contact the drain region;

applying an excitation signal to the excitation electrode of the thin film transistor while the thin film transistor is in active mode, wherein applying the excitation signal to the excitation electrode of the thin film transistor generates acoustic waves.

14. The method according to claim 13, further comprising, monitoring a voltage of the drain electrode of the thin film transistor while the thin film transistor is in active mode, wherein monitoring a voltage at the drain electrode of the thin film transistor senses acoustic waves.

15. A method for generating and/or sensing acoustic waves, comprising:

providing a thin film transistor formed on a substrate, wherein the thin film transistor comprises:

an excitation electrode;
a semiconductor thin film in contact with the excitation electrode;
an active region in the semiconductor thin film;
a gate region comprising a piezoelectric layer, wherein the gate region is in contact with the active region;
a gate electrode, wherein the gate electrode is in electrical contact with the piezoelectric layer, wherein at least a portion of the piezoelectric layer is between the gate electrode and the semiconductor thin film, wherein the gate region and the gate electrode define a source region and drain region;
a source electrode, wherein the source electrode is in electrical contact with the source region; and
a drain electrode, wherein the drain electrode is in electrical contact the drain region;
monitoring a voltage of the drain electrode of the thin film transistor while the thin film transistor is in active mode, wherein monitoring a voltage at the drain electrode of the thin film transistor senses acoustic waves.

16. The device according to claim 13,
wherein the gate region comprises a dielectric layer, wherein the dielectric layer is positioned between the semiconductor thin film and the piezoelectric layer.

17. The method according to claim 15,
wherein monitoring the voltage of the drain electrode comprises monitoring the voltage of the drain electrode after application of the excitation signal to the excitation electrode.

18. The method according to claim 13, further comprising:
providing at least one additional thin film transistor formed on the substrate,
wherein each of the at least one additional thin film transistors comprises:
an excitation electrode;
a semiconductor thin film in contact with the excitation electrode;
an active region in the semiconductor thin film;
a gate region comprising a piezoelectric layer, wherein the gate region is in contact with the active region;
a gate electrode, wherein the gate electrode is in electrical contact with the piezoelectric layer, wherein at least a portion of the piezoelectric layer is between the gate electrode and the semiconductor thin film, wherein the gate region and the gate electrode define a source region and drain region;
a source electrode, wherein the source electrode is in electrical contact with the source region; and
a drain electrode, wherein the drain electrode is in electrical contact the drain region; and
applying at least one excitation signal to the corresponding at least one additional excitation electrode of the at least one additional thin film transistor, while the at least one additional thin film transistor is in active mode, wherein applying the at least one additional excitation signal to the corresponding at least one additional excitation electrode of the at least one additional thin film transistor generates a corresponding at least one additional acoustic waves.

19. The method according to claim 18,
wherein providing the at least one additional thin film transistor formed on the substrate comprises providing at least three additional thin film transistors,
wherein the thin film transistor and the at least three additional thin film transistors are positioned to form an array of thin film transistors.

20. The method according to claim 13, further comprising:
providing a thin film transistor switch, and
driving the thin film transistor with the thin film transistor switch.

21. The method according to claim 19, further comprising:
providing a thin film transistor switch,
driving the thin film transistor with the thin film transistor switch;
providing a corresponding at least three additional thin film transistor switches, and
driving each of the corresponding at least three additional thin film transistors with a corresponding one of the at least three thin film transistors.

22. The method according to claim 13,
wherein the excitation electrode is positioned on the substrate,
wherein the semiconductor thin film is deposited on the substrate and over the excitation electrode,
wherein the gate region is on the active region.

23. The method according to claim 13,
wherein the gate electrode is positioned on the substrate, wherein the piezoelectric layer is deposited on the substrate and over the gate electrode, wherein the excitation electrode is on the active region.

24. The method according to claim 13,
wherein the excitation electrode is substantially parallel with the gate electrode.

25. The device according to claim 2,
wherein the device further comprises:
a means for putting the thin film transistor in active mode; and
a means for applying an excitation signal to the excitation electrode,
wherein the thin film transistor is configured such that acoustic waves are generated by the application of the excitation signal to the excitation electrode while the thin film transistor is in active mode.

26. The device according to claim 2,
wherein the device further comprises:
a means for putting the thin film transistor in active mode, and
a means for monitoring a voltage of the drain electrode,
wherein the thin film transistor is configured such that acoustic waves are sensed by monitoring the voltage of the drain electrode while the thin film transistor is in active mode.

27. The device according to claim 2, further comprising:
at least one additional thin film transistor formed on the substrate,
wherein each of the at least one additional thin film transistors comprises:
an excitation electrode;
a semiconductor thin film in contact with the excitation electrode;
an active region in the semiconductor thin film;
a gate region comprising a piezoelectric layer, wherein the gate region is in contact with the active region, wherein the gate region comprises a dielectric layer, wherein the dielectric layer is positioned between the semiconductor thin film and the piezoelectric layer;
a gate electrode, wherein the gate electrode is in electrical contact with the piezoelectric layer, wherein at least a portion of the piezoelectric layer is between the gate electrode and the semiconductor thin film, wherein the gate region and the gate electrode define a source region and drain region;

a source electrode, wherein the source electrode is in electrical contact with the source region; and a drain electrode, wherein the drain electrode is in electrical contact the drain region.

28. The device according to claim 2, further comprising a thin film transistor switch, wherein the thin film transistor switch drives the thin film transistor.

29. The device according to claim 2,
wherein the excitation electrode is positioned on the substrate,
wherein the semiconductor thin film is deposited on the substrate and over the excitation electrode,
wherein the gate region is on the active region.

30. The device according to claim 2,
wherein the gate electrode is positioned on the substrate, wherein the piezoelectric layer is deposited on the substrate and over the gate electrode, wherein the excitation electrode is on the active region.

31. The device according to claim 2,
wherein the excitation electrode is substantially parallel with the gate electrode.

32. The device according to claim 14,
wherein the gate region comprises a dielectric layer, wherein the dielectric layer is positioned between the semiconductor thin film and the piezoelectric layer.

33. The method according to claim 14, further comprising:
providing at least one additional thin film transistor formed on the substrate,
wherein each of the at least one additional thin film transistors comprises:
an excitation electrode;
a semiconductor thin film in contact with the excitation electrode;
an active region in the semiconductor thin film;
a gate region comprising a piezoelectric layer, wherein the gate region is in contact with the active region;
a gate electrode, wherein the gate electrode is in electrical contact with the piezoelectric layer, wherein at least a portion of the piezoelectric layer is between the gate electrode and the semiconductor thin film, wherein the gate region and the gate electrode define a source region and drain region;
a source electrode, wherein the source electrode is in electrical contact with the source region; and
a drain electrode, wherein the drain electrode is in electrical contact the drain region; and
applying at least one excitation signal to the corresponding at least one additional excitation electrode of the at least one additional thin film transistor, while the at least one additional thin film transistor is in active mode, wherein applying the at least one additional excitation signal to the corresponding at least one additional excitation electrode of the at least one additional thin film transistor generates a corresponding at least one additional acoustic waves.

34. The method according to claim 14, further comprising:
providing a thin film transistor switch, and
driving the thin film transistor with the thin film transistor switch.

35. The method according to claim 14,
wherein the excitation electrode is positioned on the substrate,
wherein the semiconductor thin film is deposited on the substrate and over the excitation electrode,
wherein the gate region is on the active region.

36. The method according to claim 14,
wherein the gate electrode is positioned on the substrate, wherein the piezoelectric layer is deposited on the substrate and over the gate electrode, wherein the excitation electrode is on the active region.

37. The method according to claim 14,
wherein the excitation electrode is substantially parallel with the gate electrode.

* * * * *

UNITED STATES PATENT AND TRADEMARK OFFICE
CERTIFICATE OF CORRECTION

PATENT NO. : 7,893,474 B2
APPLICATION NO. : 12/279412
DATED : February 22, 2011
INVENTOR(S) : Franky So et al.

It is certified that error appears in the above-identified patent and that said Letters Patent is hereby corrected as shown below:

Column 3,
Line 54, "as buffer layer." should read --as a buffer layer.--.

Column 4,
Line 39, "from Polymers"' should read --from polymers--.
Line 56, "Elastic constant, C ($10^8$ N m$^{-2}$)" should read --Elastic constant, C ($10^9$ N m$^{-2}$)--.
Line 63, "Dielectric constant, $e_g/\varepsilon_0$" should read --Dielectric constant, $\varepsilon_s/\varepsilon_0$--.

Column 5,
Line 4, "Thermal stability (° C.)" should read --Thermal stability (°C)--.
Line 6, "Receiving efficiency, $V_R$" should read --Receiving efficiency, $Y_R$--.

Column 7,
Line 12, "contact the drain" should read --contact with the drain--.
Line 64, "contact the drain" should read --contact with the drain--.

Column 8,
Line 53, "contact the drain" should read --contact with the drain--.

Column 9,
Line 16, "contact the drain" should read --contact with the drain--.
Line 51, "contact the drain" should read --contact with the drain--.

Column 11,
Line 4, "contact the drain" should read --contact with the drain--.

Column 12,
Line 8, "contact the drain" should read --contact with the drain--.
Line 17, "acoustic waves." should read --acoustic wave.--.

Signed and Sealed this
Tenth Day of May, 2011

David J. Kappos
*Director of the United States Patent and Trademark Office*